United States Patent
Kim et al.

(10) Patent No.: US 7,576,592 B2
(45) Date of Patent: Aug. 18, 2009

(54) CHARGE PUMP CIRCUIT AND METHOD OF CONTROLLING THE SAME

(75) Inventors: Hyo-jin Kim, Suwon-si (KR); Jae-sung Kang, Suwon-si (KR); Si-woo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 12/068,281

(22) Filed: Feb. 5, 2008

(65) Prior Publication Data
US 2008/0272832 A1    Nov. 6, 2008

(30) Foreign Application Priority Data
May 2, 2007     (KR)    ............. 10-2007-0042759

(51) Int. Cl.
*G05F 1/10*    (2006.01)
(52) U.S. Cl. ............................................. 327/536
(58) Field of Classification Search ......... 327/534–537, 327/390, 589
See application file for complete search history.

(56) References Cited

U.S. PATENT DOCUMENTS 5,732,039 A *   3/1998  Javanifard et al. ........... 365/226
6,337,595 B1 *  1/2002  Hsu et al. ..................... 327/538
6,486,728 B2 * 11/2002  Kleveland .................... 327/536
6,980,045 B1 * 12/2005  Liu ............................. 327/536
7,511,562 B2 *  3/2009  Kook et al. .................. 327/536

FOREIGN PATENT DOCUMENTS

| JP | 2005-129815 | 5/2005 |
| JP | 2005-192302 | 7/2005 |
| JP | 2006-120869 | 5/2006 |

* cited by examiner

*Primary Examiner*—Lincoln Donovan
*Assistant Examiner*—Hai L Nguyen
(74) *Attorney, Agent, or Firm*—Harness, Dickey & Pierce, P.L.C.

(57) ABSTRACT

A charge pump circuit and related method are provided. The charge pump circuit includes first, second and third voltage generation units, first and second control units, and a latch-up prevention unit. The first generation unit regulates a first output signal, the second generation unit boosts a second output signal, and the third generation unit boosts a third output signal in response to the first and second output signals. The first control unit is connected between the first generation unit and the third generation unit, and the second control unit is connected between the second generation unit and the third generation unit. The first and second control units block respective outputs of the first and second generation units during the boosting time for the second output signal. The latch-up prevention unit prevents a latch-up operation caused by a parasitic transistor until the third output signal is maintained at a third voltage.

44 Claims, 7 Drawing Sheets

CHARGE PUMP CIRCUIT AND METHOD OF CONTROLLING THE SAME

PRIORITY STATEMENT

This application claims the benefit of Korean Patent Application No. 10-2007-0042759, filed on May 2, 2007, in the Korean Intellectual Property Office, the disclosure of which is incorporated herein in its entirety by reference.

BACKGROUND

1. Field

Example embodiments relate to a charge pump circuit, and more particularly, to a charge pump circuit and method of controlling the same to address activation issues relating to a parasitic transistor. Example embodiments of a charge pump and related methods do not use a Schottky diode.

2. Description of the Related Art

FIG. 1 is a block diagram illustrating a conventional charge pump circuit 100.

Referring to FIG. 1, the conventional charge pump circuit 100 includes a regulator 110, a first charge pump 120, a second charge pump 130, and a booster 140. The regulator 110 regulates an input signal IN to a first output signal OUT_1 at a first voltage VCI1, and transmits the first output signal OUT_1 to the first charge pump 120, the second charge pump 130, and the booster 140. In response to the first output signal OUT_1, the first charge pump 120 outputs a second output signal OUT_2 at a second voltage AVDD. The second voltage AVDD may be twice as large as the positive value of the first voltage VC1, for example. In response to the first output signal OUT_1, the second charge pump 130 outputs a third output signal OUT_3 at a third voltage—VCI1. In response to the first output signal through the third output signal OUT_1, OUT_2, and OUT_3, the booster 140 outputs a fourth output signal OUT_4 at a fourth voltage VGH and a fifth output signal OUT_5 at a fifth voltage VGL. The fourth voltage VGH may be a positive value about four to five times as larger than a positive value of the first voltage VCI1, and the fifth voltage VGL may be a negative value that is three through to six times larger than the positive first voltage VCI1. In order to activate a liquid crystal panel, a semiconductor integrated circuit may use the fourth output signal OUT_4 or the fifth output signal OUT_5 output from the charge pump circuit 100.

FIG. 2 is a waveform diagram illustrating the output signals OUT_1, OUT_2, OUT_4, and OUT_5 of the conventional charge pump circuit 100 shown in FIG. 1

Referring to FIGS. 1 and 2, a parasitic transistor substantially, instantaneously turns on when the first output signal OUT_1 is regulated at the first voltage VCI1, and the second output signal OUT_2 is charged at a ground voltage VSS. The parasitic transistor also turns on when the fourth output signal OUT_4 is boosted from the ground voltage VSS, which may cause a latch-up operation.

FIG. 3 is a diagram illustrating a parasitic transistor generated in the case where the conventional charge pump circuit 100 shown in FIG. 1 is formed on a semiconductor substrate.

Referring to the conventional configuration of FIG. 3, when the first output signal OUT_1 is regulated, the regulator 110 operates faster than the fourth output signal OUT_4 is charged so that a PNP bipolar junction transistor substantially, instantaneously turns on. When the second output signal OUT_2 is boosted, the second output signal OUT_2 is boosted faster than the fourth output signal OUT_4 is charged so that the PNP bipolar junction transistor turns on. Also, when the fourth output signal OUT_4 is charged, the first output signal OUT_1 or the second output signal OUT_2 is boosted faster than the fourth output signal OUT_4 is charged so that the PNP bipolar junction transistor and an NPN bipolar junction transistor turn on thereby performing a latch-up operation.

FIGS. 4A and 4B are circuit diagrams illustrating conventional technology for addressing issues and/or solving problems caused by a parasitic transistor such as is shown in FIG. 3, for example.

Referring to FIG. 4A, conventionally, a problem caused by the parasitic transistor is solved by attaching an external Schottky diode to a PNP bipolar junction transistor. That is, when the PNP bipolar junction transistor turns on, current i flows to the external Schottky diode via the PNP bipolar junction transistor.

Referring to FIG. 4B, similar to that shown in FIG. 4A, an external Schottky diode is attached to a circuit which performs a latch-up operation, so as to solve the problem caused by the parasitic transistor. That is, in the case where there is no external Schottky diode both the PNP bipolar junction transistor and an NPN bipolar junction transistor turn on so that the circuit shown in FIG. 4B performs a latch-up operation. However, the latch-up operation is prevented by attaching the external Schottky diode to the circuit so that current i flows to the external Schottky via the PNP bipolar junction transistor diode.

However, in the case where the external Schottky diode is used as described above, additional components must be attached to the semiconductor device, thereby increasing cost.

SUMMARY

Example embodiments provide a charge pump circuit and method of controlling the charge pump circuit. These example embodiments may solve a turn-on problem of a parasitic transistor, without using an external Schottky diode.

An example embodiment provides a charge pump circuit. The charge pump circuit may include a first voltage generation unit regulating a first output signal at a first voltage in response to an input signal; a second voltage generation unit boosting a second output signal to a second voltage in response to the first output signal; a third voltage generation unit boosting a third output signal to a third voltage in response to the first output signal and the second output signal; a first voltage control unit connected between the first voltage generation unit and the third voltage generation unit; a second voltage control connected between the second voltage control unit and the third voltage control unit; and a latch-up prevention unit preventing a latch-up operation caused by a parasitic transistor until the third output signal is constantly maintained at the third voltage. The first voltage control unit blocks the first output signal to be output to the third voltage generation unit during the boosting time for the second output signal, and the second voltage control unit blocks the second output signal to be output to the third voltage generation unit during the boosting time for the second output signal.

According to an example embodiment, the first voltage control unit or the second voltage control unit may output a signal at a ground voltage during the boosting time for the second output signal, and outputs the first output signal after the boosting time for the second output signal.

According to an example embodiment, the first voltage control unit may include a signal block unit which blocks the first output signal during the boosting time for the second output signal in response to a first control signal and a second control signal; and a ground voltage generation unit which outputs a signal at a ground voltage during the boosting time for the second output signal in response to a third control signal.

According to an example embodiment, the signal block unit may include a first transistor having a gate, a first terminal, and a second terminal wherein the first control signal is applied to the gate, the first terminal is connected to an output terminal of the signal block unit, and the second terminal is connected to an output terminal of the first voltage generation unit; and a second transistor having a gate, a first terminal, and a second terminal wherein the second control signal is applied to the gate, the first terminal is connected to the second terminal of the first transistor and the output terminal of the first voltage generation unit, and the second terminal is connected to the first terminal of the first transistor and the output terminal of the signal block unit.

According to an example embodiment, the first transistor may be a transistor having a large resistance component in a turn-on state, and the second transistor may be a transistor having a small resistance component in a turn-on state.

According to an example embodiment, the latch-up prevention unit may be a transistor having a gate, a first terminal, and a second terminal, wherein a fourth control signal is applied to the gate, the first terminal is connected to an output terminal of the third voltage generation unit, and a ground voltage is supplied to the second terminal.

Another example embodiment provides a charge pump circuit. The charge pump circuit may includes a first voltage generation unit regulating a first output signal to a first voltage, and outputting the regulated first output signal, in response to an input signal; a second voltage generation unit boosting a second output signal to a second voltage, and outputting the boosted second output signal, in response to the first output signal; a third voltage generation unit boosting a third output signal to a third voltage in response to the first output signal and the second output signal; a first voltage control unit connected between the first voltage generation unit and the third voltage generation unit; and a second voltage control unit connected between the second voltage generation unit and the third voltage generation unit. The first voltage control unit blocks the first output signal to be output to the third voltage generation unit during the boosting time for the second output signal, and the second voltage control unit blocks the second output signal to be output to the third voltage generation unit during the boosting time for the second output signal.

Still another example embodiment provides a method of controlling a charge pump circuit outputting a signal having a constant voltage. The method may include regulating a first output signal to a first voltage in response to an input signal; boosting a second output signal to a second voltage in response to the first output signal; and boosting a third output signal to a third voltage in response to the first output signal and the second output signal. The method may also include blocking the first output signal and the second output signal during the boosting time for the second output signal.

BRIEF DESCRIPTION OF THE DRAWINGS

The above and other features and advantages of the example embodiments will become more apparent by reviewing the following detailed description of example embodiments, which references the attached drawings in which.

DETAILED DESCRIPTION OF EXAMPLE EMBODIMENTS

Figure 1:
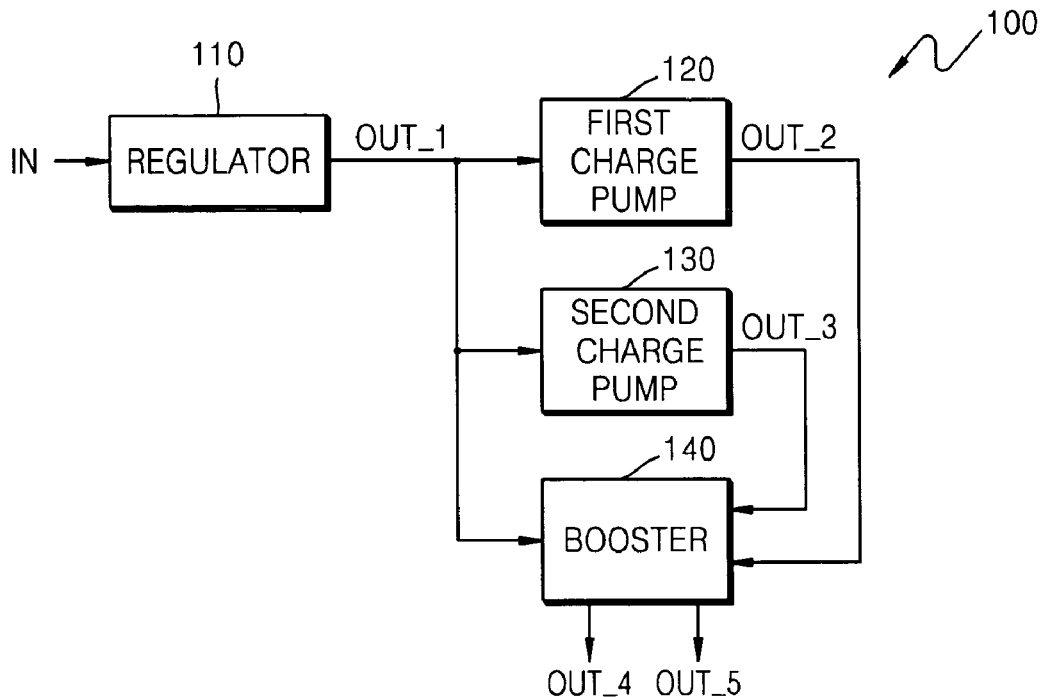
FIG. 1 is a block diagram illustrating a conventional charge pump circuit.
Figure 2:
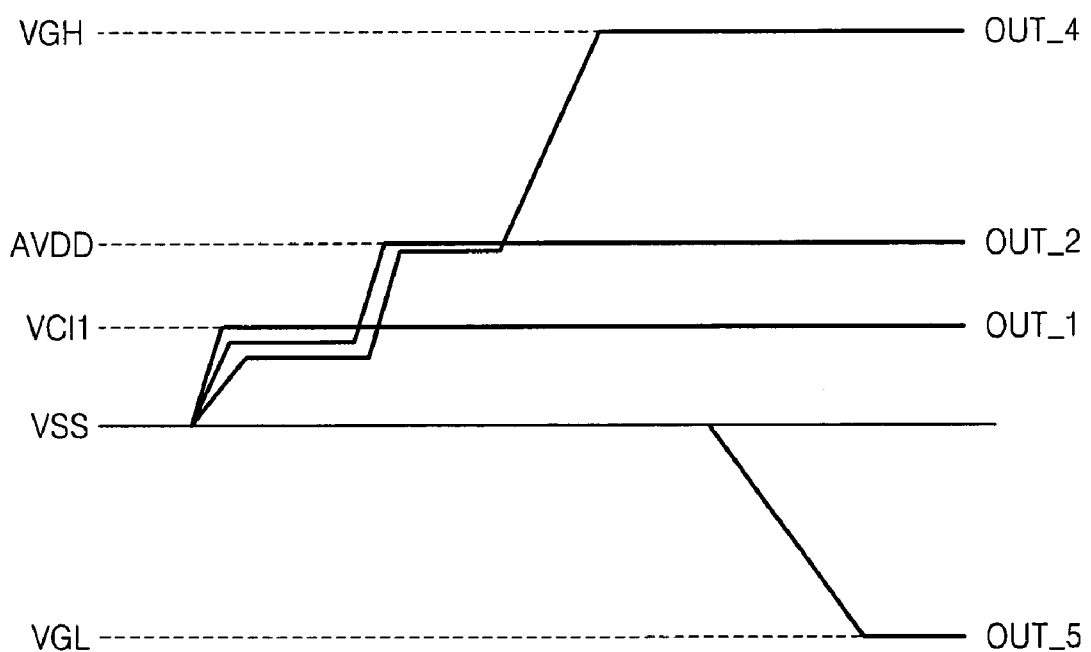
FIG. 2 is a waveform diagram illustrating the output signals of the conventional charge pump circuit shown in FIG. 1.
Figure 3:
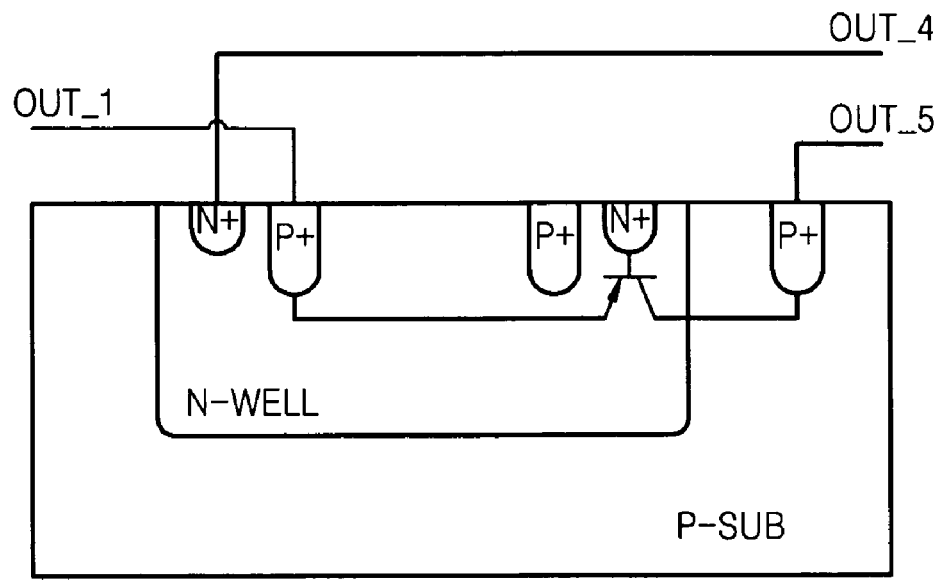
FIG. 3 is a diagram illustrating a parasitic transistor generated in the case where the charge pump circuit shown in FIG. 1 is formed on a semiconductor substrate.
Figure 4A:
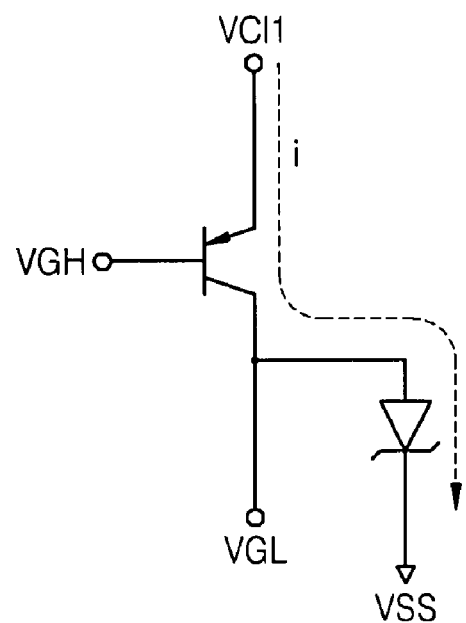
FIGS. 4A and 4B are circuit diagrams illustrating conventional technology for solving a problem caused by the parasitic transistor shown in FIG. 3.
Figure 4B:
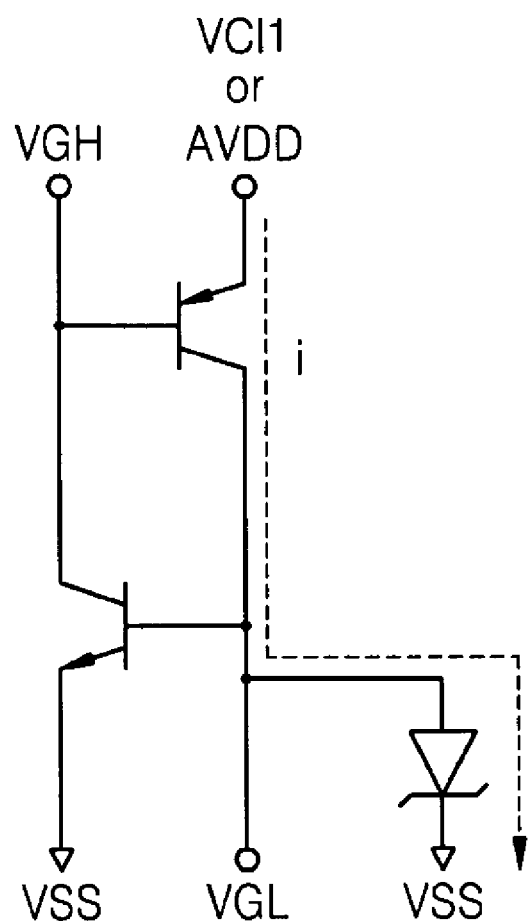

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. are used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between" , "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout.

Figure 5:
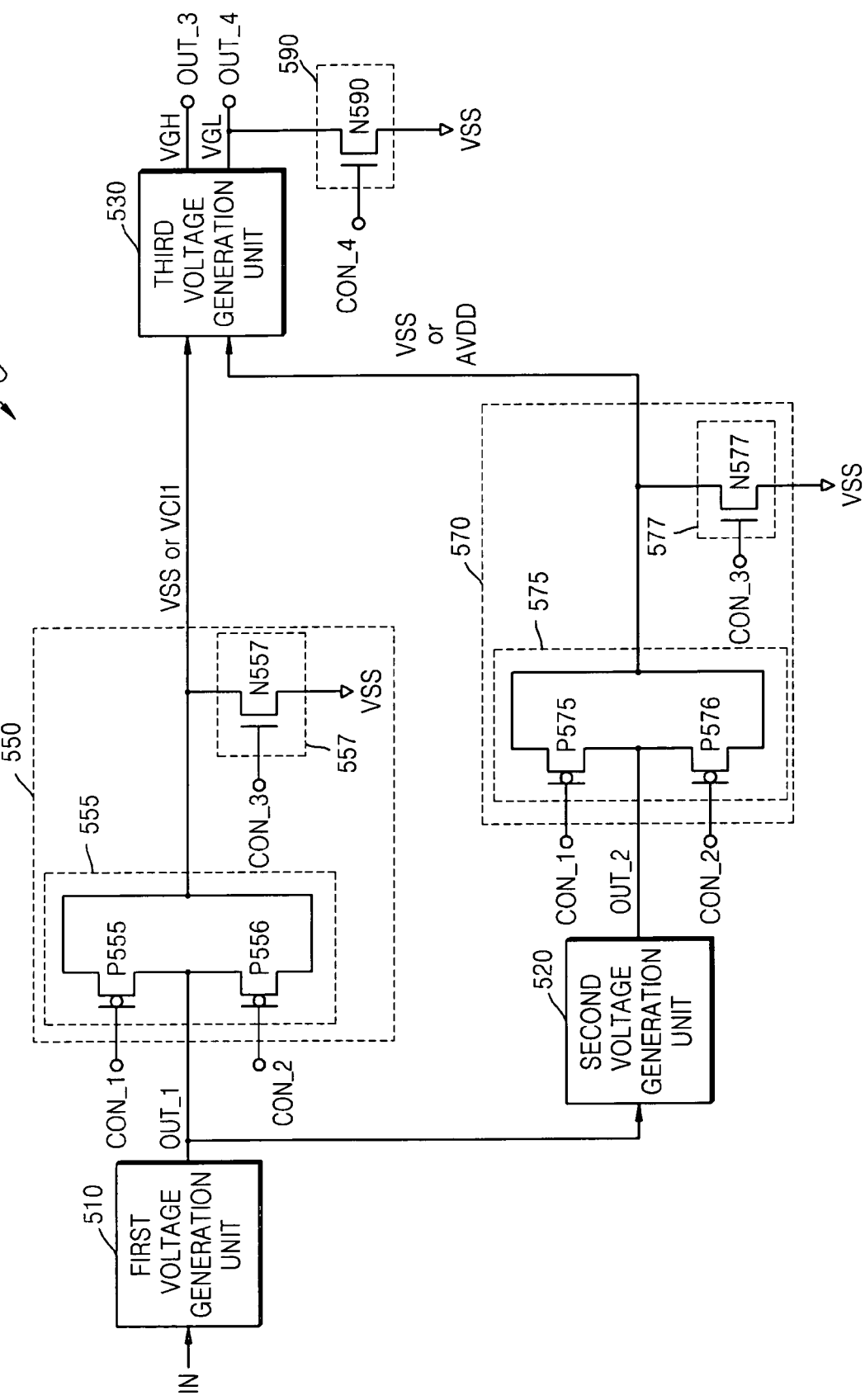
FIG. 5 is a circuit diagram of a charge pump circuit according to an embodiment.

FIG. 5 is a circuit diagram of an example embodiment of a charge pump circuit 500.

Referring to FIG. 5, the charge pump circuit 500 includes a first voltage generation unit 510, a second voltage generation unit 520, a third voltage generation unit 530, a first voltage control unit 550, a second voltage control unit 570, and a latch-up prevention unit 590.

In response to an input signal IN, the first voltage generation unit 510 regulates a first output signal OUT_1 to a first voltage VCI1, and outputs the regulated first output signal OUT_1. In FIG. 5, the first voltage generation unit outputs the first output signal OUT_1 to the first voltage control unit 550 and the second voltage generation unit 520. In response to the first output signal OUT_1, the second voltage generation unit 520 boosts a second output signal OUT_2 to a second voltage AVDD, and outputs the boosted second output signal OUT_2. In response to the first output signal OUT_1 and the second output signal OUT_2, the third voltage generation unit 530 outputs a third output signal OUT_3 at a third voltage VGH and a fourth output signal OUT_4 at a fourth voltage VGL.

The first voltage control unit 550 connected between the first voltage generation unit 510 and the third voltage generation unit 530 blocks the first output signal OUT_1 that is to be output to the third voltage generation unit 530 during a boosting time for the second output signal OUT_2. In other words, the voltage of a signal that is to be input to the third voltage generation unit 530 via the first voltage control unit 550 is equal to ground voltage VSS during the boosting time for the second output signal OUT_2, and is equal to the first voltage VCI1 after the time required for boosting the second output signal OUT_2. The operation of the first voltage control unit 550 will be described more specifically with respect to the signal diagrams of FIGS. 6A and 6B.

As shown in FIG. 5, the first voltage control unit 550 may include a signal block unit 555 and a ground voltage generation unit 557. In response to a first control signal CON_1 and a second control signal CON_2, the signal block unit 555 blocks the first output signal OUT_1 during the boosting time for the second output signal OUT_2.

The signal block unit 555 may include a first transistor P555 and a second transistor P556. The first control signal CON_1 is applied to a gate of the first transistor P555, and a first terminal of the first transistor P555 is connected to an output terminal of the signal block unit 555. The second control signal CON_2 is applied to a gate of the second transistor P556, and a first terminal of the second transistor P556 is connected to a second terminal of the first transistor P555. A second terminal of the second transistor P556 is connected to the first terminal of the first transistor P555 and the output terminal of the signal block unit 555.

The first transistor P555 may have a large resistance component in a turn-on state, and the second transistor P556 may have a small resistance component in a turn-on state. The first transistor P555 and the second transistor P556 may be P-type metal-oxide-semiconductor (PMOS) transistors, for example.

In response to a third control signal CON_3, the ground voltage generation unit 557 outputs a signal at a ground voltage VSS during the boosting time for the second output signal OUT_2. The ground voltage generation unit 557 may be a transistor N557 which includes a gate, a first terminal, and a second terminal. The third control signal CON_3 is applied to the gate of the transistor N557, the first terminal of the transistor N557 is connected to the respective output terminals of the signal block unit 555 and the first voltage generation unit 550, and a ground voltage VSS is applied to the second terminal of the transistor N557.

The second voltage control unit 570 connected between the second voltage generation unit 520 and the third voltage generation unit 530 blocks the second output signal OUT_2 that is to be output to the third voltage generation unit 530 during the boosting time for the second output signal OUT_2. In other words, the voltage of a signal that is to be input to the third voltage generation unit 530 via the second voltage control unit 570 is equal to the ground voltage VSS during the boosting time required for the second output signal OUT_2 to be boosted, and is equal to a second voltage AVDD after the boosting time. The operation of the second voltage control unit 570 is described more specifically with respect to FIGS. 6A and 6B.

Like the first voltage generation unit 550, the second voltage generation unit 570 may include a signal block unit 575 and a ground voltage generation unit 577. In response to a first control signal CON_1 and a second control signal CON_2, the signal block unit 575 blocks the second output signal OUT_2 during the boosting time for the second output signal OUT_2.

The signal block unit 575 may include a first transistor P575 and a second transistor P576. The first control signal CON_1 may be applied to a gate of the first transistor P575, and a first terminal of the first transistor P575 may be connected to an output terminal of the signal block unit 575. The second control signal CON_2 may be applied to a gate of the second transistor P576, and a first terminal of the second transistor P576 may be connected to a second terminal of the first transistor P575. A second terminal of the second transistor P576 may be connected to the first terminal of the first transistor P575 and the output terminal of the signal block unit 575.

The first transistor P575 may have a large resistance component in a turn-on state, and the second transistor P576 may have a small resistance component in a turn-on state. The first transistor P575 and the second transistor P576 may be PMOS transistors.

In response to a third control signal CON_3, the ground voltage generation unit 577 outputs a signal at a ground voltage VSS during the boosting time for the second output signal OUT_2. The ground voltage generation unit 577 may be a transistor N577 which includes a gate, a first terminal, and a second terminal. The third control signal CON_3 may be applied to the gate of the transistor N577, the first terminal of the transistor N577 may be connected to the output terminal of the signal block unit 575 and the second voltage generation unit 570, and a ground voltage VSS may be applied to the second terminal of the transistor N577.

The latch-up prevention unit 590 prevents a latch-up operation caused by a parasitic transistor until the third output signal OUT_3 is substantially, constantly maintained at the third voltage VGH. The latch-up prevention unit 590 may be a transistor N590 which includes a gate, a first terminal, and a second terminal. A fourth control signal CON_4 may be applied to the gate of the latch-up prevention unit 590, the first terminal of the latch-up prevention unit 590 may be applied to an output terminal of the third voltage generation unit 530, and a ground voltage VSS may be applied to the second terminal of the latch-up prevention unit 590. The latch-up prevention unit 590 may be connected to the output terminal of the third voltage generation unit 530 from which the fourth output signal OUT_4 is output. The transistor N590 may be an N-type metal-oxide-semiconductor (NMOS) transistor. The operation of the latch-up prevention unit 590 will be described more specifically with respect to FIGS. 6A, 6B, and 7.

Figure 6A:
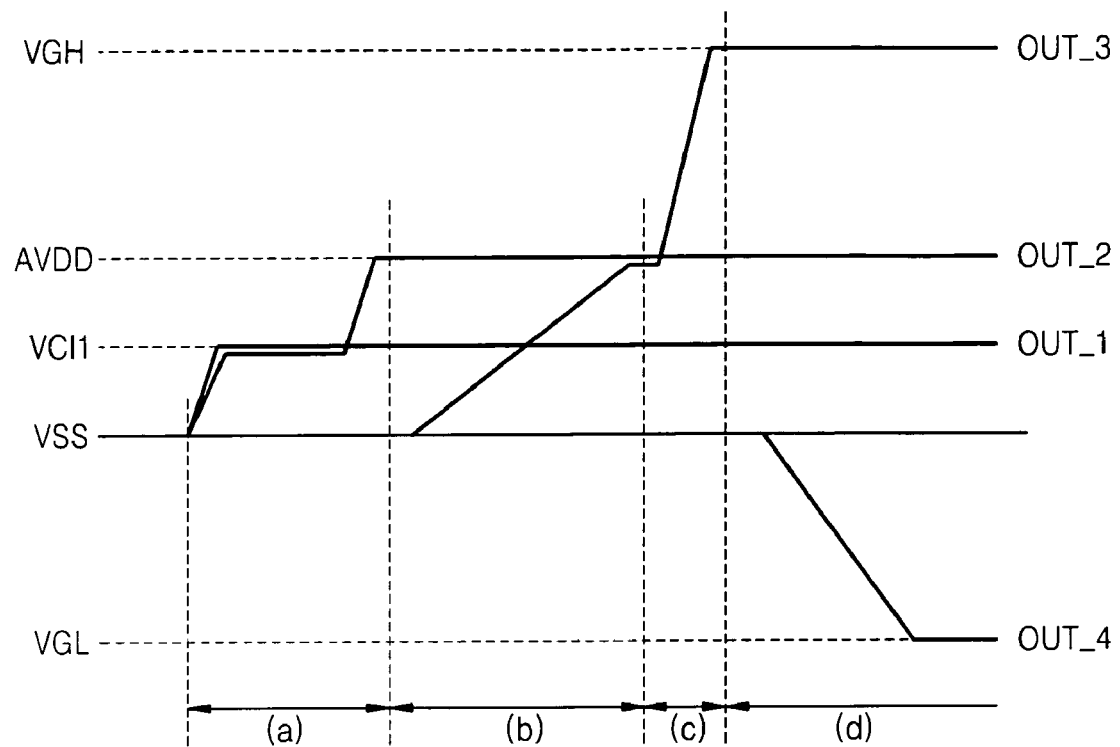
FIG. 6A is a waveform diagram illustrating output signals of the charge pump circuit shown in FIG. 5.

FIG. 6A is a waveform diagram illustrating output signals OUT_1, OUT_2, OUT_3, and OUT_4 of the example embodiment of the charge pump circuit 500 shown in FIG. 5.

Figure 6B:
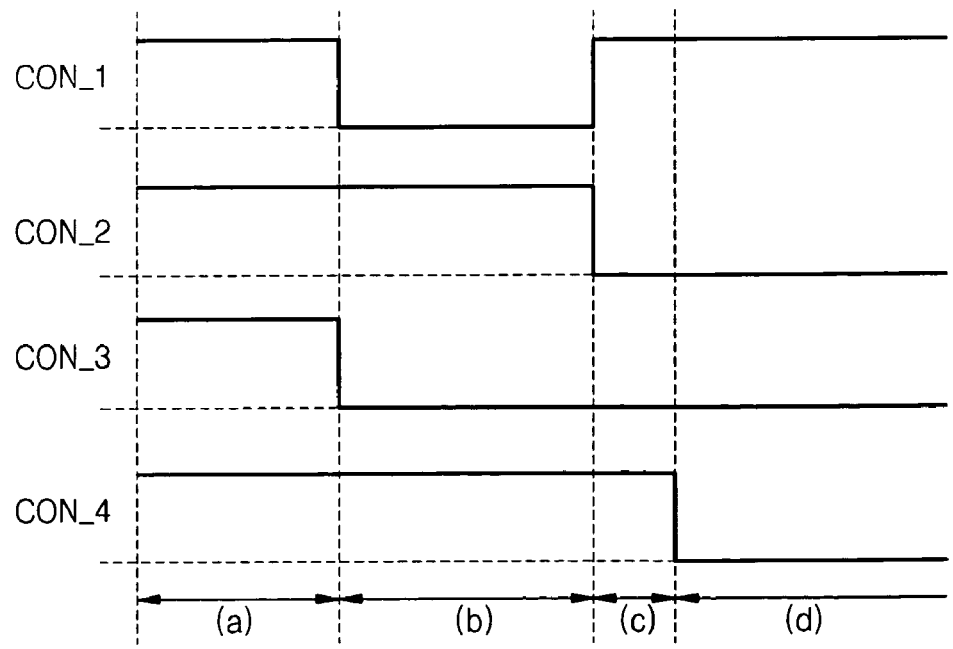
FIG. 6B is a waveform diagram illustrating control signals of the charge pump circuit shown in FIG. 5.

FIG. 6B is a waveform diagram illustrating control signals CON_1, CONT_2, CON_3, and CON_4 provided to the example embodiment of the charge pump circuit 500 shown in FIG. 5.

Referring to FIGS. 5, 6A and 6B, the first voltage control unit 550 and the second voltage control unit 570 output signals at a ground voltage VSS during a period (a) in which the second output signal OUT_2 is boosted to the second voltage AVDD. Following the period (a), during periods (b) through (d) in which the second output signal OUT_2 is substantially, constantly maintained at the second voltage AVDD, the first voltage control unit 550 outputs the first output signal OUT_1 at the first voltage VCI1 to the third voltage generation unit 530, and the second voltage control unit 570 outputs the second output signal OUT_2 at the second voltage AVDD to the third voltage generation unit 530.

To be more specific, during the period (a), the first transistor P555 and the second transistor P556 of the first voltage control unit 550 turn off, and the transistor N557 of the first voltage control unit 550 turns on. That is, since the first transistor P555 and the second transistor P556 turn off, the first voltage control unit 550 does not deliver the first output signal OUT_1 to the third voltage generation unit 530. However, since the transistor N557 turns on, the first voltage control unit 550 delivers a ground voltage VSS to the third voltage generation unit 530.

Likewise, the first transistor P575 and the second transistor P576 of the second voltage control unit 570 turn off during the period (a) and therefore, the second voltage control unit 570 does not deliver the second output signal OUT_2 to the third voltage generation unit 530. However, since the transistor N577 turns on, the second voltage control unit 570 delivers a ground voltage VSS to the third voltage generation unit 530.

Thus, a voltage of the third output signal OUT_3 is at the ground voltage VSS during the period (a) so that the parasitic transistor does not turn on.

In order to perform the aforementioned operations, the first control signal CON_1, the second control signal CON_2, and the third control signal CON_3 are maintained at a first logic state during the period (a). Hereinafter, the first logic state refers to a "logic high" state.

During the period (b) in which the second output signal OUT_2 is already boosted to the second voltage AVDD and is substantially, constantly maintained at the second voltage AVDD, the first transistor P555 of the first voltage control unit 550 turns on, and the second transistor P556 and the transistor N557 of the first voltage control unit 550 turn off so that the first output signal OUT_1 at the first voltage VCI1 is output. Here, since the first transistor P555 has the large resistance component in the turn-on state, the first voltage control unit 550 outputs the first output signal OUT_1 which has passed through the large resistance component, to the third voltage generation unit 530.

During the period (b), like in the first voltage control unit 550, the first transistor P575 of the second voltage control unit 570 turns on, and the second transistor P576 and the transistor N577 of the second voltage control unit 570 turns off so that the second output signal OUT_2 at the second voltage AVDD is output. Likewise, since the first transistor P575 has the large resistance component in the turn-on state, the second voltage control unit 570 outputs the second output signal OUT_2 which has passed through the large resistance component to the third voltage generation unit 530.

Thus, a comparison of an example embodiment described above with a conventional method indicates peak current for turning on the parasitic transistor is reduced when the third output signal OUT_3 is charged. The operation of an example embodiment of a charge pump circuit during the period (b) will be described more specifically with respect to FIG. 7.

In order to perform the aforementioned operations, during the period (b), the second control signal CON_2 is maintained at the first logic state while the first control signal CON_1 and the third control signal CON_3 transit to a second logic state. Hereinafter, the second logic state refers to a "logic low" state.

In response to the first output signal OUT_1 and the second output signal OUT_2, the third output signal OUT_3 is charged during the period (b). The aforementioned charging operation is performed via the parasitic transistor which is formed on a well. During the period (b), the third output signal OUT_3 is charged to the second voltage AVDD via the parasitic transistor, and during a period (c), the third output signal OUT_3 is boosted to the third voltage VGH by the operation of the third voltage generation unit 530.

During the period (c) in which the third output signal OUT_3 is boosted from the second voltage AVDD to the third voltage VGH, the first transistor P555 and the transistor N557 of the first voltage control unit 550 turn off, and the second transistor P556 of the first voltage control unit 550 turn on so that the first output signal OUT_1 at the first voltage VCI1 is output. Here, since the second transistor P556 has the small resistance component in the turn-on state, the first voltage control unit 550 outputs the first output signal OUT_1 which has passed through the small resistance component, to the third voltage generation unit 530. The reason for using the first transistor P555, which has the large resistance component, is to reduce the peak current for turning on the parasitic transistor when the third output signal OUT_3 is boosted from the second voltage AVDD. Therefore, after the third output signal OUT_3 is boosted to the second voltage AVDD, the third output signal OUT_3 is boosted normally by using the second transistor P556 which has the small resistance component in the turn-on state.

During the period (c), like in the first voltage control unit 550, the first transistor P575 and the transistor N577 of the second voltage control unit 570 turn off, and the second transistor P576 of the second voltage control unit 570 turns on so that the second output signal OUT_2 at the second voltage AVDD is output. Likewise, since the second transistor P576 has the small resistance component in the turn-on state, the second voltage control unit 570 outputs the second output signal OUT_2, which has passed through the small resistance component, to the third voltage generation unit 530.

In order to perform the aforementioned operations, the first control signal CON_1 transits to the first logic state while the second control signal CON_2 and the third control signal CON_3 transit to the second logic state during the period (c).

During the respective periods, a supply voltage may be used to turn on or off the first transistor P555, the second transistor P556, and the transistor N557 of the first voltage control unit 550. That is, the supply voltage may be applied to the gates of the transistors so as to turn off the first transistor P555 and the second transistor P556, or to turn on the transistor N557, for example.

Likewise, the second output signal OUT_2 at the second voltage AVDD, which has been already formed, may be used to turn on or off the first transistor P575, the second transistor P576, and the transistor N577 of the second voltage control unit 570. That is, the second output signal OUT_2 at the second voltage AVDD which has been already formed, may be applied to the gates of the transistors so as to turn off the first transistor P575 and the second transistor P576, or to turn on the transistor N577, for example.

The latch-up prevention unit 590 prevents the latch-up operation caused by the parasitic transistor until the third output signal OUT_3 is boosted to the third voltage VGH and is substantially, constantly maintained at the third voltage VGH. That is, during the periods (a) through (c), the transistor N590 of the latch-up prevention unit 590 is maintained at a turn-on state, thereby causing current flow to a ground voltage, instead of via the parasitic transistor. If the third output signal OUT_3 is substantially, constantly maintained at the third voltage VGH, the transistor N590 turns off. That is, the transistor N590 turns off before the fourth output signal OUT_4 is changed from a ground voltage to the fourth voltage VGL.

In order to perform the aforementioned operations, the fourth control signal CON_4 is at the first logic state during the periods (a) through (c), and is at the second logic stage during the period (d).

The second output signal OUT_2 at the second voltage AVDD which has already been formed, may be used to turn on the transistor N590 of the latch-up prevention unit 590. That is, when the fourth control signal CON_4 has to be at the first logic state, the second output signal OUT_2 at the second voltage AVDD which has been already formed, may be applied to the gate of the transistor N590 thereby turning on the transistor N590 so as to reduce the size of the transistor N590.

Figure 7:
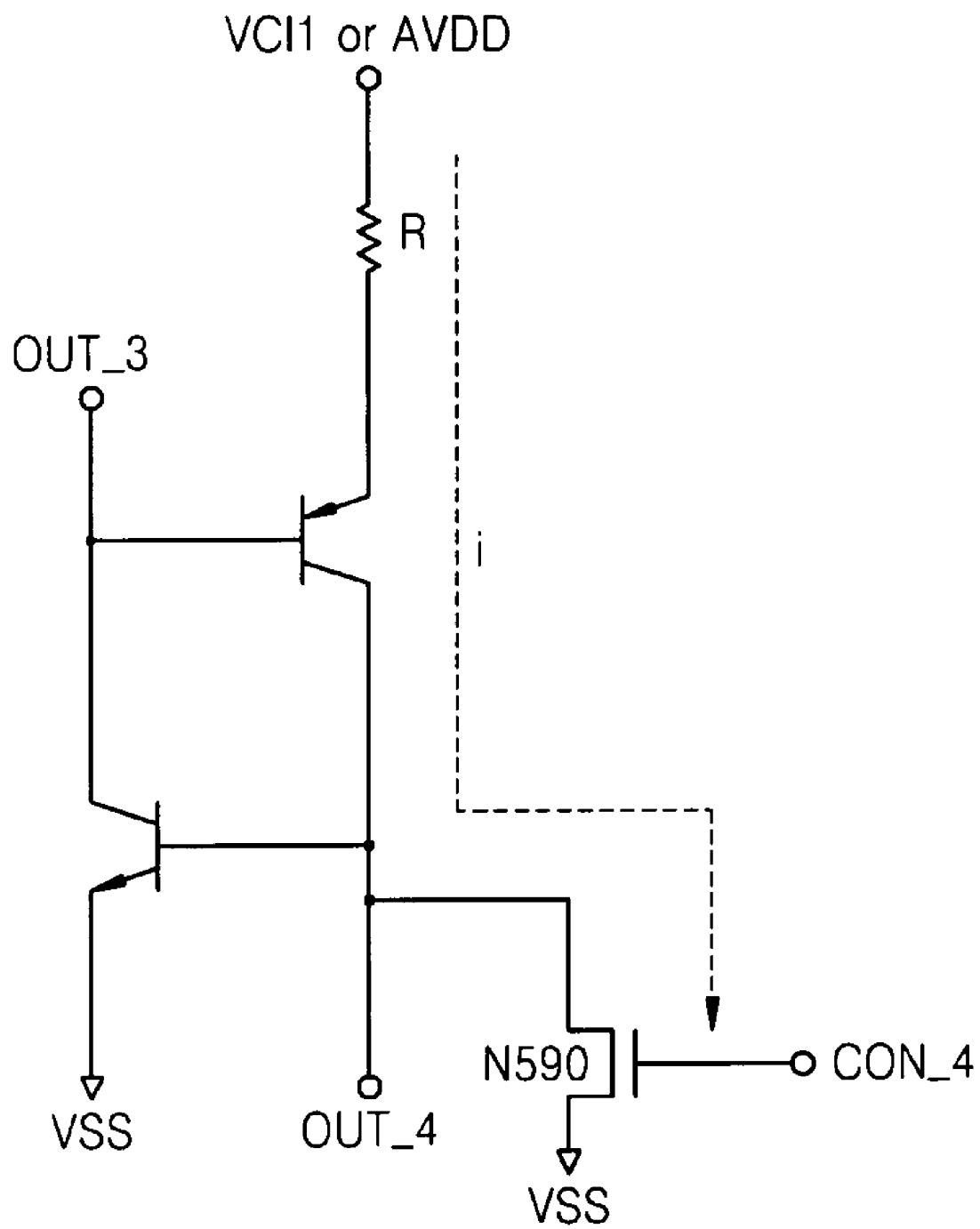
FIG. 7 is a circuit diagram schematically illustrating a circuit corresponding to a period (b) shown in FIGS. 6A and 6B.

FIG. 7 is a circuit diagram schematically illustrating a circuit during period (b) shown in FIGS. 6A through 6B.

Referring to FIGS. 5 through 7, the first transistor P555 of the first voltage control unit 550 turns on in the period (b) therefore the first transistor P555 may be denoted as a resistor R which has a large resistance value. As the resistor R has the large resistance value, a peak current value for turning on a PNP transistor is reduced when the third output signal OUT_3 is charged at a ground voltage VSS, compared to the conventional method. Also, when a voltage of the third output signal OUT_3 is less than the first voltage VCI1 of the first output signal OUT_1 during the period (b), the PNP transistor and an NPN transistor shown in FIG. 7 turn on. Here, the transistor N590 of the latch-up prevention unit 590 is also in a turn-on state so that current i via the PNP transistor flows to a ground voltage VSS via the transistor N590 of the latch-up prevention unit 590.

Likewise, the first transistor P575 of the second voltage control unit 570 turns on in the period (b). Therefore the first transistor P575 may be denoted as a resistor R which has a large resistance value. As the resistor R has the large resistance value, a peak current value for turning on a PNP transistor is reduced when the third output signal OUT_3 is charged at a ground voltage VSS, compared to the conventional method. Since a voltage of the third output signal OUT_3 is less than the second voltage AVDD of the second output signal OUT_2 during the period (b), the PNP transistor and the NPN transistor shown in FIG. 7 turn on during the period (b). Here, the transistor N590 of the latch-up prevention unit 590 is also in the turn-on state so that current i via the PNP transistor flows to a ground voltage VSS via the transistor N590 of the latch-up prevention unit 590.

Thus, the example embodiment of the charge pump circuit 500 reduces the peak current value for turning on the PNP transistor by turning on the first transistors P555 and P575, which have the large resistance components, and prevents the latch-up operation from occurring by turning on the transistor N590 of the latch-up prevention unit 590.

Figure 8:
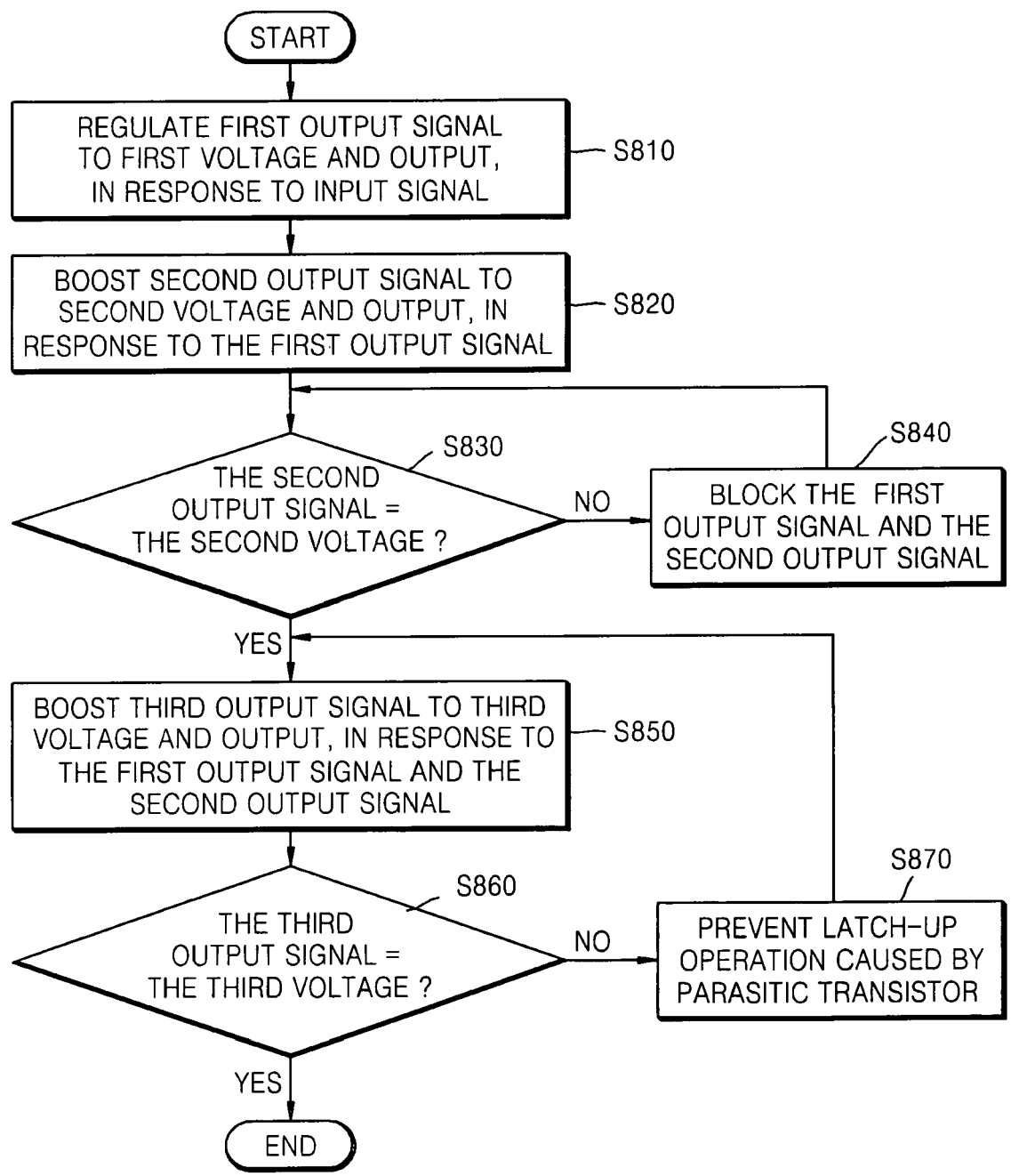
FIG. 8 is a flowchart illustrating an example embodiment of a method of controlling a charge pump circuit.

FIG. 8 is a flowchart illustrating an example embodiment of a method of controlling a charge pump circuit.

Referring to FIGS. 5 through 8, in response to an input signal, the first voltage generation unit 510 regulates a first output signal OUT_1 to a first voltage VCI1, and outputs the regulated first output signal OUT_1 in operation 810. In response to the first output signal OUT_1, the second voltage generation unit 520 boosts a second output signal OUT_2 to a second voltage AVDD, and outputs the boosted second output signal OUT_2 in operation 820. While the second output signal OUT_2 is boosted to the second voltage AVDD in operation 830, the first voltage control unit 550 and the second voltage control unit 570 block the first output signal OUT_1 and the second output signal OUT_2 that are to be output to the third voltage generation unit 530 in operation 840. When the second output signal OUT_2 is boosted to the second voltage AVDD and is substantially, constantly maintained at the second voltage AVDD, the first voltage control unit 550 and the second voltage control unit 570 output the first output signal OUT_1 and the second output signal OUT_2 to the third voltage generation unit 530. In response to the first output signal OUT_1 and the second output signal OUT_2, the third voltage generation unit 530 boosts a third output signal OUT_3 to a third voltage VGH in operation 850. Until the third output signal OUT_3 is substantially, constantly maintained at the third voltage VGH in operation 860, the latch-up prevention unit 590 prevents a latch-up operation caused by a parasitic transistor in operation 870.

As described above, a charge pump circuit and method of controlling the same according to example embodiments described above address issues and/or solve problems related to turn on of a parasitic transistor, without using a Schottky diode. In other words, compared to a conventional method, an external Schottky diode is not used so that the number of parts and/or components to be attached to a semiconductor device, chip size, and cost are reduced. Also, when an output voltage is boosted to a substantially, constant voltage, peak current is decreased thereby reducing power consumption of example embodiments as compared with conventional devices.

While example embodiments have been particularly shown and described above, it will be understood by those of ordinary skill in the art that various changes in form and details of those example embodiments may be made therein without departing from the spirit and scope of this disclosure.

What is claimed is:

1. A charge pump circuit comprising:
   a first voltage generation unit regulating a first output signal at a first voltage in response to an input signal;
   a second voltage generation unit boosting a second output signal to a second voltage in response to the first output signal;
   a third voltage generation unit boosting a third output signal to a third voltage in response to the first output signal and the second output signal;
   a first voltage control unit connected between the first voltage generation unit and the third voltage generation unit, the first voltage control unit blocking the first output signal to be output to the third voltage generation unit during the boosting time for the second output signal;

a second voltage control unit connected between the second voltage generation unit and the third voltage generation unit, the second voltage control unit blocking the second output signal to be output to the third voltage generation unit during the boosting time for the second output signal; and a latch-up prevention unit preventing a latch-up operation caused by a parasitic transistor until the third output signal is constantly maintained at the third voltage.

2. The charge pump circuit of claim 1, wherein the first voltage control unit outputs a signal at a ground voltage during the boosting time for the second output signal, and outputs the first output signal after the boosting time for the second output signal.

3. The charge pump circuit of claim 1, wherein the first voltage control unit comprises:

a signal block unit blocking the first output signal during the boosting time for the second output signal in response to a first control signal and a second control signal; and a ground voltage generation unit outputting a signal at a ground voltage during the boosting time for the second output signal in response to a third control signal.

4. The charge pump circuit of claim 3, wherein the signal block unit comprises:

a first transistor having a gate, a first terminal, and a second terminal wherein the first control signal is applied to the gate, the first terminal is connected to an output terminal of the signal block unit, and the second terminal is connected to an output terminal of the first voltage generation unit; and a second transistor having a gate, a first terminal, and a second terminal wherein the second control signal is applied to the gate, the first terminal is connected to the second terminal of the first transistor and the output terminal of the first voltage generation unit, and the second terminal is connected to the first terminal of the first transistor and the output terminal of the signal block unit.

5. The charge pump circuit of claim 4, wherein the first transistor is a transistor having a large resistance component in a turn-on state, and the second transistor is a transistor having a small resistance component in a turn-on state.

6. The charge pump circuit of claim 5, wherein the first transistor turns on after the boosting time for the second output signal until the third output signal is charged to the second voltage, and the second transistor turns on when the third output signal is boosted from the second voltage to the third voltage.

7. The charge pump circuit of claim 4, wherein the first transistor and the second transistor are PMOS (P-type metal-oxide-semiconductor) transistors, and when one of the first transistor and the second transistor turns off, a supply voltage is supplied to the gate of one of the first transistor and the second transistor.

8. The charge pump circuit of claim 3, wherein the first control signal is at a first logic state during the boosting time for the second output signal, is at a second logic state after the boosting time for the second output signal until the third output signal is charged to the second voltage, and is at the first logic state when the third output signal is boosted from the second voltage to the third voltage, and the second control signal is at a first logic state from when the second output signal is boosted until the third output signal is charged to the second voltage, and is at a second logic state when the third output signal is boosted from the second voltage to the third voltage.

9. The charge pump circuit of claim 3, wherein the ground voltage generation unit is a transistor having a gate, a first terminal, and a second terminal, wherein the third control signal is applied to the gate, the first terminal is connected to the output terminal of the signal block unit and an output terminal of the first voltage control unit, and a ground voltage is supplied to the second terminal.

10. The charge pump circuit of claim 9, wherein the transistor turns on during the boosting time for the second output signal.

11. The charge pump circuit of claim 9, wherein the transistor is an NMOS (N-type metal-oxide-semiconductor) transistor, and when the transistor turns on, a supply voltage is supplied to the gate of the transistor.

12. The charge pump circuit of claim 3, wherein the third control signal is at a first logic state during the boosting time for the second output signal, and is at a second logic state after the boosting time for the second output signal.

13. The charge pump circuit of claim 1, wherein the second voltage control unit outputs a signal at a ground voltage during the boosting time for the second output signal, and outputs the second output signal after the boosting time for the second output signal.

14. The charge pump circuit of claim 1, wherein the second voltage control unit comprises:

a signal block unit blocking the second output signal during the boosting time for the second output signal in response to a first control signal and a second control signal; and a ground voltage generation unit outputting a signal at a ground voltage during the boosting time for the second output signal in response to a third control signal.

15. The charge pump circuit of claim 14, wherein the signal block unit comprises:

a first transistor having a gate, a first terminal, and a second terminal, wherein the first control signal is applied to the gate, the first terminal is connected to an output terminal of the signal block unit, and the second terminal is connected to an output terminal of the second voltage generation unit; and a second transistor having a gate, a first terminal, and a second terminal, wherein the second control signal is applied to the gate, the first terminal is connected to the second terminal of the first transistor and an output terminal of the second voltage generation unit, and the second terminal is connected to the first terminal of the first transistor and the output terminal of the signal block unit.

16. The charge pump circuit of claim 15, wherein the first transistor is a transistor having a large resistance component in a turn-on state, and the second transistor is a transistor having a small resistance component in a turn-on state.

17. The charge pump circuit of claim 16, wherein the first transistor turns on after the boosting time for the second output signal until the third output signal is charged to the second voltage, and the second transistor turns on when the third output signal is boosted from the second voltage to the third voltage.

18. The charge pump circuit of claim 15, wherein the first transistor and the second transistor are PMOS transistors, and when one of the first transistor and the second transistor turn off, the second output signal at the second voltage is applied to a gate of one of the first transistor and the second transistor.

19. The charge pump circuit of claim 14, wherein the first control signal is at a first logic state during the boosting time for the second output signal, is at a second logic state after the boosting time for the second output signal until the third output signal is charged to the second voltage, and is at the first logic state when the third output signal is boosted from the second voltage to the third voltage, and the second control signal is at a first logic state from when the second output signal is boosted until the third output signal is charged to the second voltage, and is at a second logic state when the third output signal is boosted from the second voltage to the third voltage.

20. The charge pump circuit of claim 14, wherein the ground voltage generation unit is a transistor having a gate, a first terminal, and a second terminal, wherein the third control signal is applied to the gate, the first terminal is connected to the output terminal of the signal block unit and an output terminal of the second voltage control unit, and a ground voltage is supplied to the second terminal.

21. The charge pump circuit of claim 20, wherein the transistor turns on during the boosting time for the second output signal.

22. The charge pump circuit of claim 21, wherein the transistor is an NMOS transistor, and when the transistor turns on, the second output signal at the second voltage is applied to the gate of the transistor.

23. The charge pump circuit of claim 14, wherein the third control signal is at a first logic state during the boosting time for the second output signal, and is at a second logic state after the boosting time for the second output signal.

24. The charge pump circuit of claim 1, wherein the latch-up prevention unit is a transistor having a gate, a first terminal, and a second terminal, wherein a fourth control signal is applied to the gate, the first terminal is connected to an output terminal of the third voltage generation unit, and a ground voltage is supplied to the second terminal.

25. The charge pump circuit of claim 24, wherein the transistor turns on until the third output signal is constantly maintained at the third voltage.

26. The charge pump circuit of claim 24, wherein the transistor is an NMOS transistor, and when the transistor turns on, the second output signal at the second voltage is applied to the gate of the transistor.

27. The charge pump circuit of claim 24, wherein the fourth control signal is at a first logic state until the third output signal is constantly maintained at the third voltage.

28. A charge pump circuit comprising:
a first voltage generation unit regulating a first output signal to a first voltage, and outputting the regulated first output signal, in response to an input signal;
a second voltage generation unit boosting a second output signal to a second voltage, and outputting the boosted second output signal, in response to the first output signal;
a third voltage generation unit boosting a third output signal to a third voltage, in response to the first output signal and the second output signal;
a first voltage control unit connected between the first voltage generation unit and the third voltage generation unit, the first voltage control unit blocking the first output signal to be output to the third voltage generation unit during the boosting time for the second output signal; and a second voltage control unit connected between the second voltage generation unit and the third voltage generation unit, the second voltage control unit blocking the second output signal to be output to the third voltage generation unit during the boosting time for the second output signal.

29. The charge pump circuit of claim 28, wherein one of the first voltage control unit and the second voltage control unit outputs a signal at a ground voltage during the boosting time for the second output signal, and outputs one of the first output signal and the second output signal after the boosting time for the second output signal.

30. The charge pump circuit of claim 28, wherein the first voltage control unit outputs a signal at a ground voltage during the boosting time for the second output signal, and outputs the first output signal after the boosting time for the second output signal.

31. The charge pump circuit of claim 28, wherein the first voltage control unit comprises:
a signal block unit blocking the first output signal during the boosting time for the second output signal in response to a first control signal and a second control signal; and
a ground voltage generation unit outputting a signal at a ground voltage during the boosting time for the second output signal in response to a third control signal.

32. The charge pump circuit of claim 31, wherein the signal block unit comprises:
a first transistor having a gate, a first terminal, and a second terminal, wherein the first control signal is applied to the gate, the first terminal is connected to an output terminal of the signal block unit, and the second terminal is connected to an output terminal of the first voltage generation unit; and
a second transistor having a gate, a first terminal, and a second terminal, wherein the second control signal is applied to the gate, the first terminal is connected to the second terminal of the first transistor and the output terminal of the first voltage generation unit, and the second terminal is connected to the first terminal of the first transistor and the output terminal of the signal block unit.

33. The charge pump circuit of claim 32, wherein the first transistor is a transistor having a large resistance component in a turn-on state, and
the second transistor is a transistor having a small resistance component in a turn-on state.

34. The charge pump circuit of claim 28, wherein the second voltage control unit comprises:
a signal block unit blocking the second output signal during the boosting time for the second output signal in response to a first control signal and a second control signal; and
a ground voltage generation unit outputting a signal at a ground voltage during the boosting time for the second output signal in response to a third control signal.

35. The charge pump circuit of claim 34, wherein the signal block unit comprises:
a first transistor having a gate, a first terminal, and a second terminal, wherein the first control signal is applied to the gate, the first terminal is connected to an output terminal of the signal block unit, and the second terminal is connected to an output terminal of the second voltage generation unit; and
a second transistor having a gate, a first terminal, and a second terminal, wherein the second control signal is applied to the gate, the first terminal is connected to the second terminal of the first transistor and an output terminal of the second voltage generation unit, and the second terminal is connected to the first terminal of the first transistor and the output terminal of the signal block unit.

36. The charge pump circuit of claim 35, wherein the first transistor is a transistor having a large resistance component in a turn-on state, and the second transistor is a transistor having a small resistance component in a turn-on state.

37. A method of controlling a charge pump circuit outputting a signal having a constant voltage, the method comprising:

regulating a first output signal to a first voltage in response to an input signal;

boosting a second output signal to a second voltage in response to the first output signal;

blocking the first and second output signal during the boosting time for the second output signal; and boosting a third output signal to a third voltage in response to the first output signal and the second output signal.

38. The method of claim 37, further comprising:

receiving a first control signal and a second control signal, and the blocking of the first and second output signal is based on the received first control signal and a second control signal.

39. The method of claim 38, wherein the first control signal is at a first logic state during the boosting time for the second output signal, is at a second logic state after the boosting time for the second output signal until the third output signal is charged to the second voltage, and is at the first logic state when the third output signal is boosted from the second voltage to the third voltage, and the second control signal is at a first logic state from when the second output signal is boosted until the third output signal is charged to the second voltage, and is at a second logic state when the third output signal is boosted from the second voltage to the third voltage.

40. The method of claim 37, further comprising:

outputting a signal at a ground voltage during the boosting time for the second output signal.

41. The method of claim 40, further comprising:

receiving a third control signal, and the outputting of the signal outputs the signal at the ground voltage during the boosting time for the second output signal in response to the received third control signal, the third control signal being a first logic state during the boosting time for the second output signal and a second logic state after the boosting time for the second output signal.

42. The method of claim 37, further comprising:

preventing a latch-up operation caused by a parasitic transistor until the third output signal is constantly maintained at the third voltage.

43. The method of claim 42, further comprising:

receiving a fourth control signal, and the preventing of the latch-up operation causes a turn-on current of a parasitic transistor flow to a ground voltage in response to the fourth control signal.

44. The method of claim 43, wherein the fourth control signal is at a first logic state until the third output signal is constantly maintained at the third voltage.

* * * * *